(12) United States Patent
Gonzalez et al.

(10) Patent No.: US 6,468,852 B1
(45) Date of Patent: Oct. 22, 2002

(54) METHODS OF FORMING FIELD EFFECT TRANSISTORS; METHODS OF FORMING DRAM CIRCUITRY

(75) Inventors: Fernando Gonzalez, Boise, ID (US); Chandra Mouli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/922,338

(22) Filed: Aug. 3, 2001

(51) Int. Cl.[7] .......................................... H01L 21/8238
(52) U.S. Cl. ...................................................... 438/217
(58) Field of Search ................................ 438/174, 176, 438/289, 217, 218, 230

(56) References Cited

U.S. PATENT DOCUMENTS

| | | | |
|---|---|---|---|
| 5,413,949 A | 5/1995 | Hong | 437/44 |
| 5,512,770 A | 4/1996 | Hong | 257/345 |
| 5,899,732 A | 5/1999 | Gardner et al. | 438/473 |
| 6,187,643 B1 | 2/2001 | Borland | 438/302 |
| 6,238,982 B1 | 5/2001 | Krivokapic et al. | 438/275 |

Primary Examiner—David Nelms
Assistant Examiner—Quoc Hoang
(74) Attorney, Agent, or Firm—Wells St. John P.S.

(57) ABSTRACT

Embodiments of the present invention provide methods of forming field effect transistors (FETs) that include at least partially forming a patterned transistor gate stack, at least partially defining a channel region therebeneath, and at least partially forming source/drain regions operably adjacent the gate stack and the channel region. Such embodiments include conducting one or more ion implantations through the at least partially formed gate stack and the at least partially formed source/drain regions to appropriately form $V_t$ adjust regions within the channel regions and minority carrier barrier regions below formed, or to be formed, source/drain regions. Some embodiments of the present invention encompass forming such regions for memory FETs employed in DRAM or other memory circuitry.

50 Claims, 4 Drawing Sheets

_FIG. 1_

_FIG. 2_

FIG. 4

METHODS OF FORMING FIELD EFFECT TRANSISTORS; METHODS OF FORMING DRAM CIRCUITRY

TECHNICAL FIELD

This invention relates generally to methods of forming field effect transistors, and more specifically to methods for forming field effect transistors having implanted $V_t$ adjust regions and minority carrier barrier regions.

BACKGROUND OF THE INVENTION

Generally a field effect transistor or FET encompasses a gate structure, source/drain regions operably adjacent the gate structure and a channel region under the gate structure and between the source/drain regions. The gate structure can encompasses a conductive electrode and an insulative layer or gate dielectric disposed between the electrode and the channel region, where each of the gate electrode and gate dielectric can encompass one or more appropriate layers and/or materials. For example, some gate electrodes include a conductively doped polysilicon layer and one or more strapping layers formed of titanium silicide, tungsten nitride and the like. Generally, the gate structure is formed overlying a substrate and the channel and source/drain regions are formed within the substrate, although other constructs are known. While many factors influence and or control the operation of such a FET, one of the more important factors is the physical gate length L, which is generally understood to be the spacing between the source/drain regions of a FET and is a starting point for determining the effective gate length.

Reducing the gate length of FETs generally results in increased switching speeds and makes possible both lower operating voltages and increases in the functional density of integrated circuits that have many thousands of such FETs. However, as L becomes smaller, some issues that are detrimental to FET performance can become problematic. One such issue is transistor sub-threshold leakage that results in current drain in the transistor off state.

Several methods for controlling such sub-threshold leakage are known. Such methods generally involve the performing of one or more ion implant steps to (1) form doped regions in the channel region, (2) modify doping profiles both laterally and elevationally in the channel and source/drain regions and (3) form additional doped regions that can serve to shape and control the flow of electrons and holes that make the operation of such FETs possible.

While the control of sub-threshold leakage is a concern for essentially all FETs, as L is reduced such leakage can be problematic in memory integrated circuits, for example, dynamic random access memory or DRAM circuits. Such DRAM circuits generally contain as many as millions of DRAM cells that each have a FET and a charge storage device, the FET controlling access to the stored charge. Where sub-threshold leakage is relatively high, the stored charge can rapidly dissipate and thus effect the frequency with which the stored charge need be refreshed. Where refresh rates are unnecessarily high, overall performance of the DRAM is reduced.

One feature of merit for DRAM performance is the "drain-induced barrier lowering" (DIBL) effect versus junction leakage on the storage node side of a device. Parametrically this can be viewed as sub-threshold leakage versus "source/drain diode leakage." While reducing the physical gate length can effect threshold voltage or $V_t$, such can also be effected by the dopant concentration in the channel region as well as that in the source/drain regions. Generally, high dopant density is desirable to reduce sub-threshold leakage (DIBL or sub-$V_t$), while low dopant density and/or graded junctions are desirable to reduce the diode or junction leakage. Increasing source/drain dopant concentration for improving DIBL, thus generally increases leakage current for both the junctions and between proximate FETs. Thus rather than just a single ion implant for forming source/drain regions, often source/drain regions are engineered to consist of a number of regions such as lightly doped drain (LDD) regions, halo regions and the like to achieve a desired balance between sub-threshold leakage and diode junction leakage.

While the use of ion implantation to form the various doped regions discussed above is well known, generally such implants are done early in the fabrication process of the FET. Thus, control of such regions is hampered by thermal processing that is needed to form the gate structure and other features of the FET. As a result, where a $V_t$ adjust region having a specific peak dopant concentration is desired at a specific location in the channel area of a FET, the thermal processing needed to subsequently form the gate structure generally is "factored in" to achieve the desired result. In addition, often one implantation can effect the result of another prior or subsequent implantation thus adding complexity to the fabrication process. For example, a $V_t$ implant prior to forming the gate structure will place dopant in areas where source/drain regions are to be received and thus is generally "factored-in" to achieve a desired result for such source/drain regions, when formed. Unfortunately, such "factoring" increases the difficulty of providing the desired dopant concentration or desired location of a region. As additional regions are designed to overcome problems that result from the scaling downward in FET size, "factoring" becomes even more difficult.

Therefore it would be advantageous to have methods for forming FETs and DRAM or other memory circuitry that. provides for the elimination or reduction in the complexity of forming such devices. It would be also be advantageous to have methods that reduce or eliminate the effect of one ion implantation on another ion implantation or the effect of subsequent thermal processing on the result of an ion implantation. Additionally, it would be advantageous to have methods that reduce the number of such ion implantation steps conducted in the forming of such FETs and DRAM or other memory circuitry.

SUMMARY

The invention includes methods of forming field effect transistors and DRAM circuitry. In one embodiment, in accordance with the present invention, a patterned transistor gate stack is at least partially formed over a semiconductor substrate. The patterned gate stack has opposing sidewalls and at least partially defines a channel region therebeneath within the semiconductor substrate. Ion implanting is conducted through the patterned gate stack to within the semiconductor substrate to form a $V_t$ adjust region of the transistor within the channel region. After the ion implanting, insulative spacers are formed over the gate stack sidewalls. Source/drain regions are at least. partially formed operably proximate the channel region.

In another embodiment of the invention, transistor gate material is formed over a semiconductor substrate and photosensitive masking material is provided over the transistor gate material. The masking material is patterned to form a desired transistor gate outline. With the patterned masking material received over the transistor gate material, exposed transistor gate material is etched effective to at least partially form a patterned transistor gate stack and to at least partially define a channel region therebeneath within the semiconductor substrate. After the etching and with the patterned masking material still in place, ion implanting is conducted through the patterned masking material and the patterned transistor gate stack to within the semiconductor substrate to form a $V_t$ adjust region of the transistor within the channel region. Source/drain regions operably proximate the channel region are formed.

In another embodiment, a patterned transistor gate stack is at least partially formed over a semiconductor substrate. The patterned gate stack has opposing sidewalls and at least partially defines a channel region therebeneath within the semiconductor substrate and at least partially defines opposing source/drain areas. Ion implanting is conducted through the patterned transistor gate stack and into the source/drain areas to within the semiconductor substrate to simultaneously form a $V_t$ adjust region of the transistor within the channel region and respective minority carrier barrier regions to be received within the semiconductor substrate spaced below source/drain regions. Source/drain regions are formed within the source/drain areas operably proximate the channel region. Other embodiments in accordance with the present invention are contemplated, disclosed and claimed hereinbelow.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where the element is the same between drawings common numbering of elements within such drawings is employed.

FIG. 3 is a diagrammatic sectional view of a semiconductor wafer fragment at a step of another method in accordance with an aspect of the invention.

FIG. 4 is a view of the FIG. 3 wafer fragment at another step of the method shown by FIG. 3.

DETAILED DESCRIPTION

This disclosure of the invention is submitted in furtherance of the constitutional purposes of the U.S. Patent Laws "to promote the progress of science and useful arts" (Article 1, Section 8).

Embodiments in accordance with the present invention will be described with reference to the aforementioned figures. Various modifications, adaptations or variations of the specific methods and or structures described may become apparent to those skilled in the art as such embodiments of the present invention are described. All such modifications, adaptations or variations that rely upon the teachings of the present invention, and through which these teachings have advanced the state of the art, are considered to be within the scope and spirit of the present invention.

Methods of forming field effect transistors (FETs) and methods of forming DRAM circuitry, in accordance with the present invention are described herein with reference to FIGS. 1–6. In the context of these descriptions, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The term "transistor gate stack" or "gate stack" is defined to mean any transistor gate construction encompassing at least a conductive gate electrode and a gate dielectric layer underlying the gate electrode. Materials for forming the gate electrode include, but are not limited to gate material layers such as polycrystalline or amorphous silicon, metal silicides, conductive metal oxides and/or nitrides, metals such as aluminum or tungsten and combinations of such and other appropriate materials. Materials for forming the gate dielectric layer include, but are not limited to silicon oxides, silicon nitrides, transition metal oxides and combinations of such and other appropriate materials. In addition, the term "minority carrier barrier region" is defined to mean a doped region formed proximate a field effect transistor within an active area of a semiconductor substrate, the doped region having a concentration of a dopant type opposite that of source/drain regions of the proximate transistor.

Figure 1:
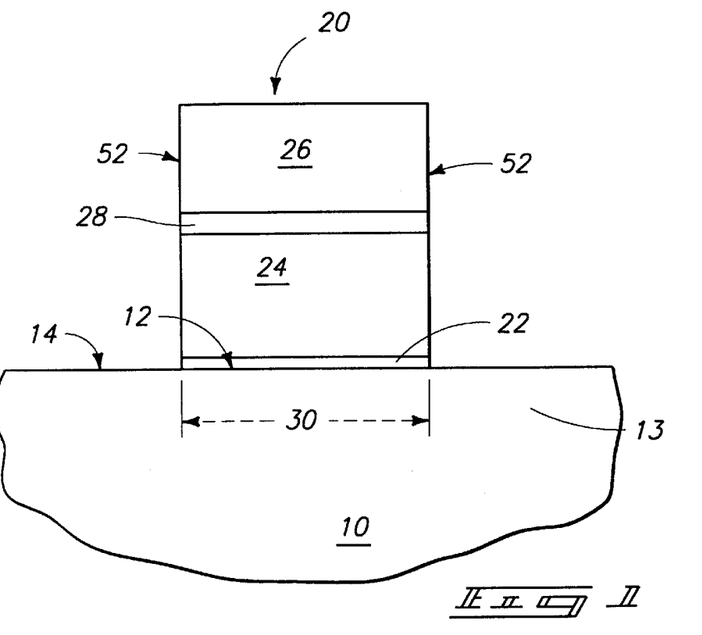
FIG. 1 is a diagrammatic sectional view of a semiconductor wafer fragment at a step of a method in accordance with an aspect of the invention.

Referring to FIG. 1, a semiconductor wafer fragment 10 is shown at a step of a method in accordance with the present invention. Wafer fragment 10 typically encompasses a silicon material 13 having an outer surface 14, although as discussed above other appropriate materials can be employed. A transistor gate stack 20 is at least partially formed over fragment 10 to at least partially define a channel region 30 within material 13. As depicted, at least partially defined channel region 30 extends into fragment 10 from an interface 12 of gate stack 20 with wafer fragment surface 14, and at least partially formed transistor gate stack 20 is shown essentially completely formed.

Gate stack 20 encompasses a gate dielectric layer 22, a gate electrode 24 and an optional capping layer 26. In addition to capping layer 26, gate stack 20 can encompass one or more other optional layers 28, which are depicted for simplicity and ease of understanding as a unitary layer having one exemplary position within stack 20. Generally, some optional layers 28, if provided, are to enhance the conductivity of the gate electrode, although for embodiments of the present invention, such optional layers 28 also provide for obtaining a specific projected range ($R_p$) of an ion implantation directed through gate stack 20, as will be described below. Other optional layers 28 can be employed for patterning transistor gate stack 28. Therefore, optional layers 28 include, but are not limited to tungsten (W), tungsten silicide (WSi), tungsten nitride (WN), titanium nitride (TiN), titanium silicide (TiSi) or any other appropriate gate material layer for enhancing conductivity and obtaining a desired $R_p$, and photosensitive materials employed to define or pattern gate stack 20. With regard to optional capping layer 26, such layer 26 generally encompasses a silicon nitride-comprising material although other material encompassing silicon oxides and silicon oxynitrides can also be employed. It will be noted that while capping layer 26 is referred to as an optional layer, such reference is only to its use for obtaining a desired $R_p$ for gate stack 20. Thus in some embodiments of the present invention, while capping layer 26 may be optional with regard obtaining $R_p$, such layer can provide other desirable functionality and hence be provided.

Each of the several materials that can be employed for gate dielectric layer 22, gate electrode 24, optional capping layer 26 and optional layers 28 can be formed using appropriate conventional or yet-to-be developed methods. Thus in an exemplary process, gate layer 22 can be a silicon oxide material formed by a thermal oxidation process; gate electrode 24 can be a polycrystalline material formed by a low pressure chemical vapor deposition process (LPCVD); capping layer 26, if formed, can be a silicon nitride material also formed by an LPCVD process; the one. or more optional layers 28 can be a WN material formed by a plasma enhanced chemical vapor deposition (PECVD) process and include a photosensitive material for patterning stack 20. When patterned, gate stack 20 encompasses laterally opposing sidewalls 52.

Figure 2:
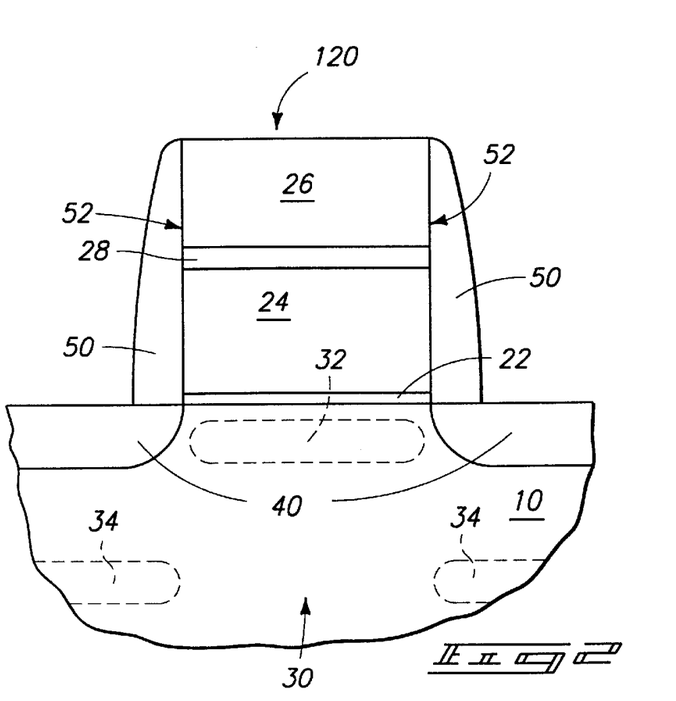
FIG. 2 is a view of the FIG. 1 wafer fragment at another step of the method shown by FIG. 1.

Turning now to FIG. 2, insulative spacers 50 are formed adjacent laterally opposing sidewalls 52 of gate stack 20. In some embodiments spacers 50 are formed of a material that is selectively etchable with respect to the material of capping layer 26, if present, or of whatever material is encompassed by an uppermost portion of stack 20. For example, where capping layer 26 is a silicon nitride material, insulative spacers 50 can be formed of a silicon oxide material to ensure selective etchability of the material of spacers 50 with respect to the material of capping layer 26, however other embodiments can employ materials for spacers 50 that are not selectively etchable. Formation of spacers 50 can be by conventional or other means. For example, a layer of the material of spacers 50 is first formed over substrate 10, generally as a blanket forming (not shown). Then such layer of material is etched anisotropically to form spacers 50, the etching typically being performed without a photo masking layer being formed.

Still referring to FIG. 2, source/drain regions 40 are depicted formed operably proximate channel region 30 and gate stack 20. Where the FET being formed by the method of the present invention is an exemplary N-type FET, source/drain regions 40 will be formed of a N-type dopant such as arsenic (Ar) or phosphorous (P), where the background doping of semiconductor wafer fragment 10 is P-type. While for an exemplary P-type FET, a P-type dopant such as boron (B) or boron fluoride ($BF_2$) is employed for regions 40, and the background doping is N-type. While the specific concentration of the N-type dopant in source/drain regions 40 will vary as a function of the specific application of the FET, among other things, generally source/drain regions 40 are formed to have highest dopant concentration regions within the area of fragment 10 depicted by FIG. 2.

It will be noted that source/drain regions 40 are depicted as unitary regions for ease of understanding only. Thus while some embodiments in accordance with the present invention can be formed with unitary source/drain regions, for example often DRAM access FETs are so formed, other embodiments of the instant invention will have additional "source/drain engineering." That is to say, the source/drain regions of such other embodiments of the present invention can encompass LDD, halo or other source/drain tailoring regions.

Also depicted in FIG. 2 are $V_t$ adjust region 32 and minority carrier barrier region 34. Advantageously, some embodiments in accordance with the present invention provide for the essentially simultaneous forming of regions 32 and 34 with a single implant of P-type dopant. The different elevational positioning of regions 32 and 34 is provided, in part, by forming gate stack 20 to have a specific projected range or $R_p$ for the ion implantation of the specific dopant selected that is different from the $R_p$ for areas laterally adjacent stack 20. Such forming of gate stack 20 to have a specific $R_p$ being a function of selecting appropriate materials and thickness of such materials for each of the layers encompassed by gate stack 20. Thus, where such an ion implantation is conducted into semiconductor wafer fragment 10, regions of surface 14 not overlaid with transistor gate stack 20 are penetrated by the implanted ions to a greater depth than regions of surface 14 that are overlaid with gate stack 20.

In addition to selecting appropriate materials of appropriate thicknesses for gate stack 20, it is advantageously found that for any such desired $R_p$, a specific implant energy for each of the specific dopants implanted can also provide for appropriately positioning both $V_t$ adjust region 32 received within channel region 30 and minority carrier barrier region 34 received within wafer fragment 10, below source/drain regions 40. Thus in one embodiment, a peak concentration of $V_t$ adjust region 32 can be immediately adjacent gate stack 20 within channel region 30, and minority carrier barrier region 34 can be spaced apart from source/drain regions 40, as depicted, while in another embodiment the peak concentration of $V_t$ adjust region 32 can be maintained as above and minority carrier barrier region 34 can be formed adjacent source/drain regions 40 by appropriately selecting a desired Rp for stack 20 and an appropriate implant energy for each.

It will be noted, that control of the dopant concentration and position, particularly peak dopant concentrations and their positions, for each region is preferably free from the influence of the thermal processing associated with forming gate stack 20. This is particularly beneficial for $V_t$ adjust region 32 in N-type FETs where the forming of gate dielectric layer 22 by thermal oxidation often reduces the amount of dopant present in such region. In addition, the higher $R_p$ for the regions adjacent gate stack 20 preferably provides that essentially none of the dopant used for forming regions 34 is received within the area of fragment 10 where source/drain regions 40 are formed. Thus the effect of a prior ion implantation, to form regions 32 and 34, or a subsequent ion implantation, to form regions 40, is essentially eliminated. Also, source/drain regions 40 can advantageously be formed either prior to or after the forming of regions 32 and 34 and the forming of insulative spacers 50, eliminating any effect due to the thermal processing of forming insulative spacers 50.

Still referring to FIG. 2, for some embodiments in accordance with the present invention, the forming of regions 32 and 34 is accomplished by conducting more than one ion implantation where different ion implant energies are employed for each of the implantations. In this manner the distribution of a peak dopant concentration within each region 32 and 34 can be further controlled. Thus in an exemplary embodiment, two ion implantations are conducted where at least one implant energy is selected that cannot pass through gate stack 20. Thus the peak dopant concentration of regions 32 and 34 are different form one another as region 34 receives dopant from both implantations while region 32 from only one implantation.

It will be realized that at least partially forming transistor gate stack 20 includes completely forming stack 20 where all of the materials encompassed by stack 20 are removed from regions where source/drain regions 40 are to be received, as well as only removing only some of such material prior to forming $V_t$ adjust region 32 and minority carrier barrier region 34. In this manner additional control of an $R_p$ ratio between gate stack 20 and the adjacent areas can be achieved. For essentially the same purpose, where an optional layer 28 encompassing a photosensitive material is employed for patterning gate stack 20, such material can allowed to remain while ion implantation to form regions 32 and 34 is conducted. Finally, while gate dielectric layer 22 is not shown over areas where source/drain regions 40 are to be formed, it will be noted that in some embodiments of the present invention, layer 22 is provided over such areas.

Referring now to FIG. 3, a diagrammatic sectional view of a semiconductor wafer fragment 100 at a step of another method in accordance with present invention is shown. Semiconductor wafer fragment 100 includes memory array area 110, first peripheral circuitry area 112 and second peripheral circuitry area 114 shown separated from each other by isolation regions 116. Memory area 110 is configured to encompass a plurality of memory cell field effect transistor gates. First peripheral circuitry area 112 is configured to encompass a plurality of first conductivity type field effect transistor gates and second peripheral circuitry area 114 is configured to encompass a plurality of second conductivity type field effect transistor gates. However, for simplicity and ease of understanding, only a single gate stack 120, 122 and 124 is shown for each of the plurality of FETs of each area 110, 112 and 114. In addition, and also for simplicity and ease of understanding, gate stacks 122 and 124 are each shown as a block representation without the detail of the internal structure of each gate stack. It will be understood that while not shown, some embodiments in accordance with the present invention, include some or all of the features described with respect to memory array area 110 and memory gate stack 120 appropriately configured for first peripheral area 112 and/or second peripheral area 114 and respective gate stacks 122 and/or 124.

It will be noted that while wafer fragment 100 encompasses DRAM circuitry not shown in FIGS. 1 and 2, fragment 100 is otherwise analogous to wafer fragment 10 of FIGS. 1 and 2. In addition, memory array transistor gate stack 120 is analogous to transistor gate stack 20 of FIG. 1 and includes the additional features and embodiments described with regard to gate stack 20 as depicted in FIG. 2. Such relationship is indicated by the common element numbering utilized for the several components of such gate stack.

Referring to memory array area 110 and memory array gate stack 120, such include gate dielectric layer 22, gate electrode 24, optional capping layer 26 and one or more other optional layers 28, which are depicted for simplicity and ease of understanding as a unitary layer having one exemplary position within stack 120. In addition, channel region 30 is seen disposed within wafer fragment 100, defined by gate stack 120. The previously provided descriptions of each of layers 22, 26 and 28, as well as electrode 24 and channel region 30 are incorporated herein.

Turning now to FIG. 4, a view of wafer fragment 100 at another step of the method shown by FIG. 3 is depicted. FIG. 4 includes $V_t$ adjust region 32 and minority carrier barrier region 34 depicted within memory array area 110. A peripheral area masking layer 150, typically formed from a photosensitive material, is disposed over wafer fragment 100 and patterned to mask peripheral areas 112 and 114 and expose memory area 110. Masking layer 150 is generally formed prior to the forming of regions 32 and 34. In this manner, the forming of regions 32 and 34 is only within memory array area 110. Thus as regions 32, 34 and 40 depicted in FIG. 4 are analogous to such regions depicted in and previously discussed with regard to FIG. 2, such regions can be formed prior to or after the forming of source drain regions 40. In addition, the position of such regions within memory array area 110 can be controlled by the selection of an appropriate material and thickness of such appropriate material for gate stack 120 as well by as the specific ion and ion implant energy selected for forming regions 32 and 34, as previously discussed.

In addition, wafer fragment 100 includes first peripheral area 112 which further includes first peripheral source/drain regions 42. In some embodiments, source/drain regions 40 are formed in conjunction with the forming of source/drain regions 42, for example, regions 40 are formed concurrently with the forming of an LDD region (not shown) of source/drain regions 42. Also, insulative spacers 50 are shown formed adjacent laterally opposing sidewalls 52 of gate stack 120 in a manner analogous to that discussed for gate stack 20 in FIG. 2. While the previously discussed method of forming spacers 50 is applicable to the embodiment of FIG. 4, such forming can additionally be concurrent with the forming of spacers 55 adjacent gate stacks 122 and 124 or alternatively distinct from such forming.

It will be noted that in some embodiments in accordance with the present invention, a required gate material thickness to be received over a channel region of the transistor being formed, as well as a required masking thickness, if any, to be received over source/drain areas can be provided. Such thicknesses are determined to be effective to form a $V_t$ adjust implant region within the channel region and respective minority carrier barrier regions spaced beneath the source/drain regions. It will be further noted that such determining is for each and/or any selected ion species to be implanted at each/and any selected ion implant energy. Once required thicknesses are determined, appropriate materials of the determined thicknesses are formed over appropriate channel and source/drain regions and the ion implantation is conducted to form the appropriate regions. In addition, for embodiments that encompass a peripheral circuitry area, it will be noted that some or all of the appropriate circuitry formed within such peripheral areas can optionally encompass required gate material thicknesses to be received over the channel regions of transistors being formed within such peripheral areas, as well as a required masking thickness, if any, to be received over source/drain areas being formed within such peripheral areas. Where such optional required material thicknesses are determined and such materials formed, the peripheral circuitry areas advantageously encompass $V_t$ adjust regions within channel regions and respective minority carrier barrier regions. It will be realized that such optional regions will be tailored for the peripheral circuitry areas within which they are formed.

Figure 5:
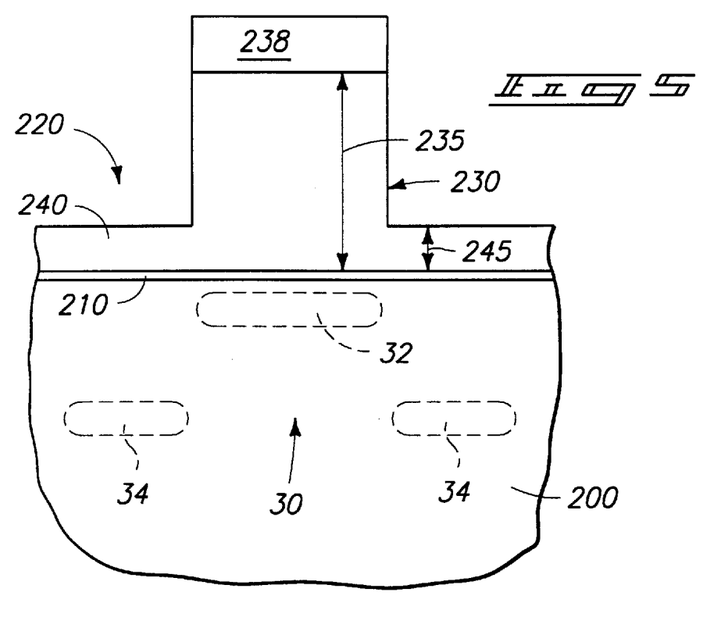
FIG. 5 is a diagrammatic sectional view of a semiconductor wafer fragment at a step of another method in accordance with and aspect of the invention.

Referring to FIG. 5, a diagrammatic sectional view of a semiconductor wafer fragment 200 is shown at a step of another method in accordance with present invention. Wafer fragment 200 is essentially analogous with fragments 10 and 100. Dielectric layer 210 is disposed over wafer fragment 200 and conductive material layer 220 is disposed over layer 210. Conductive material layer 220 has a first portion 230 having a first thickness 235 and a second portion 240 having a second thickness 245, where first thickness 235 is greater than second thickness 245.

Dielectric layer 210 is formed of a material appropriate for forming a gate dielectric layer and thus includes such materials mentioned above for such a layer. Conductive material layer 220 is formed, having first thickness 235, of a material appropriate for forming a gate electrode and thus includes such materials mentioned above for such a layer. Both layers 210 and 220 can be formed by conventional or any other appropriate methods.

After material layer 220 is formed, a masking layer (not shown) is formed and patterned to mask first portion 230 and expose second portions 240. Masked material layer 220 is exposed to conditions suitable to remove only some of the material of exposed portions 240. In this manner, first thickness 235 is reduced to second thickness 245 within portions 240. Such removal of material from portions 240 partially defines first portions 230 as a transistor stack and a region therebeneath as a channel region, where such transistor stack and channel region will be subsequently completely formed.

In an alternate embodiment an optional capping material (not shown) is formed over material layer 220 prior to patterning. The masking layer (not shown) is formed over such optional capping material and patterned as described above. Subsequently, material is removed from exposed second portions 240 such that all of the optional capping material is removed from such exposed portions and an optional gate capping layer 238 is left disposed only over first portion 230. In this manner additional thickness can be provided to first portion 230.

A $V_t$ adjust region 32 and minority carrier barrier regions 34 are then subsequently formed by exposing wafer fragment 200 to appropriate ion implantation conditions, as previously discussed with respect to FIG. 2. It should be noted that while portions 230 and 240 essentially encompass only a single material, in the absence of optional gate capping layer 238, appropriate positioning of regions 32 and 34 is achieved by selecting appropriate thicknesses 235 and 245, as well as an appropriate ion and an appropriate ion implant energy.

While not shown, in some embodiments the masking material is not removed until after the ion implanting to form regions 32 and 34. In other embodiments the masking material is removed before the ion implanting. The removal or non-removal of the masking material is independent of the presence of optional gate capping layer 238. In addition, in some embodiments where the masking material is removed, optional spacers (not shown) are formed adjacent first portion 230 prior to the ion implanting. While the forming of the optional spacers is independent of the presence of gate capping layer 238, it will be understood that the selection of material for forming such spacers must be made such that the material selected can be selectively etched from gate capping layer 238.

Figure 6:
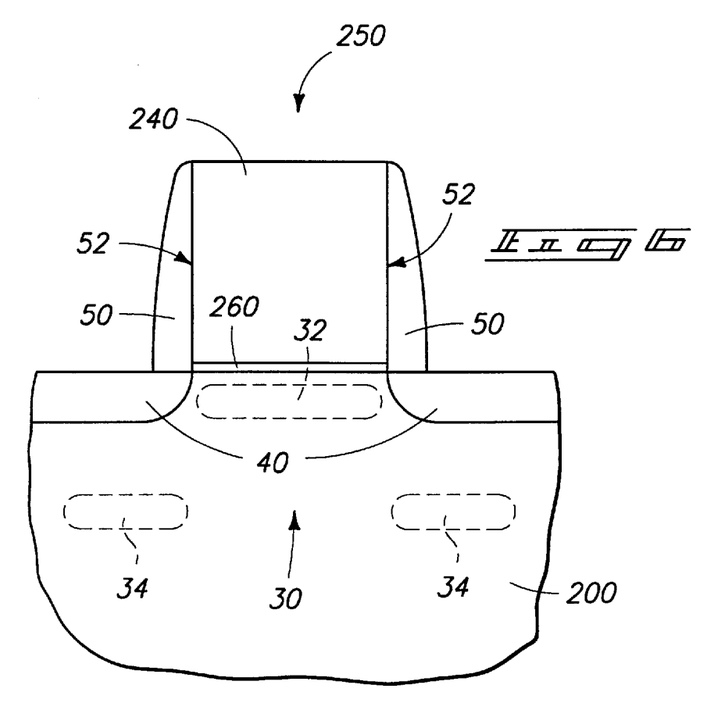
FIG. 6 is a view of the FIG. 5 wafer fragment at another step of the method shown by FIG. 5.
Figure 11:
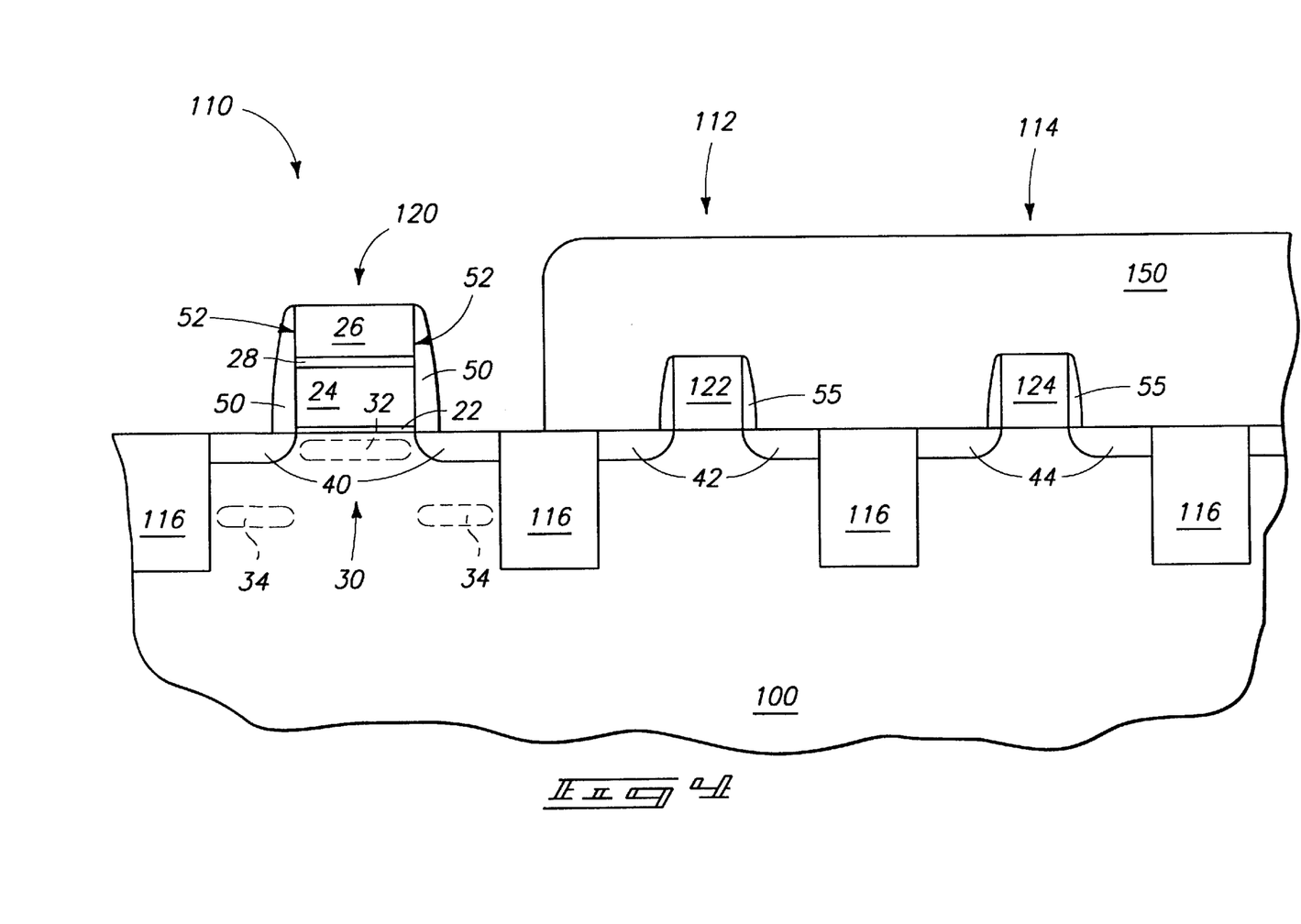

Turning to FIG. 6, a view of wafer fragment 200 at another step of the method shown by FIG. 5 is depicted. Source/drain regions 40 are shown formed operably adjacent a transistor gate stack 250 and a channel region 30, where such gate stack and channel region were previously partially defined as indicated above. Transistor gate stack 250 is formed by the removing of essentially all material remaining within portions 240 after the ion implanting. As shown, all remaining material includes material of dielectric layer 210, however in some embodiments, the material of dielectric layer 210 within second portions 240 is not removed. Generally, source/drain regions 40 are formed after the forming of transistor gate stack 250. In some embodiments insulative spacers 50 are formed adjacent sidewalls 52 of gate stack 250 prior to forming regions 40 while in other embodiments, spacers 50 are formed after regions 40 are formed. It should be noted, that while source/drain regions 40 are described as generally formed after forming gate stack 250, in some embodiments of the present invention, regions 40 are formed prior to forming gate stack 250. In these embodiments, source/drain regions 40 are formed by conducting an ion implant with an appropriate dopant ion and at an appropriate ion implant energy to place such regions within wafer fragment 200 below dielectric layer 230 and remaining portions 240.

It will also be noted that the specific alternate methods and/or embodiments, and their advantages, discussed with respect to any of FIGS. 1–6, can generally be applied to any other appropriate embodiment even if not specifically discussed or mentioned above. For example, the forming of regions 32 and 34 using more than one ion implantation as discussed with respect to FIG. 2, can also be applied to any of the embodiments discussed with respect to FIGS. 4 and 6.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field effect transistor comprising:

at least partially forming a patterned transistor gate stack over a semiconductor substrate, the patterned gate stack having opposing sidewalls and at least partially defining a channel region therebeneath within the semiconductor substrate;

ion implanting through the patterned gate stack to within the semiconductor substrate and forming a $V_t$ adjust region of the transistor with the channel region therefrom;

after conducting the $V_t$ ion implanting, forming insulative spacers over the gate stack sidewalls; and at least partially forming source/drain regions operably proximate the channel region.

2. The method of claim 1, wherein the at least partially forming a patterned transistor gate stack comprises:

forming at least one gate material layer over the semiconductor substrate;

forming and patterning a masking layer over the gate material layer, the patterned masking layer exposing portions of the gate material layer; and removing at least some of the exposed portions of the gate material layer.

3. The method of claim 2, wherein the ion implanting is conducted through the masking layer and the masking layer is removed after the ion implanting.

4. The method of claim 1, wherein the at least partially forming a patterned transistor gate stack further comprises completely forming the transistor gate stack prior to the ion implanting.

5. The method of claim 1, wherein the forming of the insulative spacers comprises depositing a blanket layer of insulative material over the patterned gate stack and anisotropically etching the blanket layer without a masking step.

6. The method of claim 1, wherein the ion implanting comprises employing an implant energy appropriate to position a peak dopant concentration of the $V_t$ adjust region within the channel region immediately adjacent the patterned gate stack.

7. The method of claim 1, wherein the at least partially forming the source/drain regions comprises forming a respective peak dopant concentration region within the semiconductor substrate prior to the ion implanting.

8. The method of claim 1, wherein the at least partially forming the source/drain regions comprises forming a respective peak dopant concentration region within the semiconductor substrate after the ion implanting.

9. The method of claim 1, wherein the ion implanting further comprises forming a minority carrier barrier region within the semiconductor substrate to be below each source/drain region.

10. The method of claim 9, wherein the minority carrier barrier region is formed to be spaced from each source/drain region.

11. A method of forming a field effect transistor comprising:
   forming transistor gate material over a semiconductor substrate;
   providing photosensitive masking material over the transistor gate material;
   patterning the masking material to form a desired transistor gate outline;
   with the patterned masking material received over the transistor gate material, etching exposed transistor gate material effective to at least partially form a patterned transistor gate stack and at least partially define a channel region therebeneath within the semiconductor substrate;
   after the etching and with the patterned masking material still in place, ion implanting through the patterned masking material and the patterned transistor gate stack to within the semiconductor substrate and forming therefrom a $V_t$ adjust region of the transistor within the channel region; and
   forming source/drain regions operably proximate the channel region.

12. The method of claim 11, wherein the ion implanting comprises one or more ion implantations, each ion implantation having an ion implant energy appropriate for positioning a peak dopant concentration of the $V_t$ adjust region below the transistor gate stack in the channel region within the semiconductor substrate.

13. The method of claim 11, wherein the patterning of the masking material comprises a photolithographic process.

14. The method of claim 11, wherein the photosensitive masking material comprises photoresist and the patterning of the masking material comprises a photolithographic process.

15. The method of claim 11, wherein the forming of the source/drain regions is prior to the ion implanting.

16. The method of claim 11, wherein the forming of the source/drain regions is after the ion implanting.

17. The method of claim 11, wherein the etching of the exposed transistor gate material is effective to completely form the patterned transistor gate stack.

18. The method of claim 11, wherein the patterned transistor gate stack comprises opposing sidewalls and further comprising forming insulative spacers adjacent the opposing sidewalls.

19. The method of claim 18, wherein the forming of the source/drain regions is before the forming of the insulative spacers.

20. The method of claim 11, wherein the ion implanting further comprises forming respective minority carrier barrier regions within the semiconductor substrate to be spaced below the source/drain regions.

21. A method of forming a field effect transistor comprising:
   at least partially forming a patterned transistor gate stack over a semiconductor substrate, the patterned gate stack having opposing sidewalls and at least partially defining a channel region therebeneath within the semiconductor substrate and at least partially defining opposing source/drain areas;
   ion implanting through the patterned transistor gate stack and into the source/drain areas to within the semiconductor substrate to simultaneously form a $V_t$ adjust region of the transistor within the channel region and respective minority carrier barrier regions to be received within the semiconductor substrate spaced below source/drain regions; and
   forming source/drain regions within the source/drain areas operably proximate the channel region.

22. The method of claim 21, wherein the source/drain regions are formed to have highest dopant concentration regions which are formed prior to the ion implanting.

23. The method of claim 21, wherein the source/drain regions are formed to have highest dopant concentration regions which are formed after the ion implanting.

24. The method of claim 21, wherein the ion implanting comprises a plurality of ion implantations, each of the plurality comprising an implant energy appropriate to form $V_t$ adjust region of the transistor within the channel region and the minority carrier barrier regions to be received within the semiconductor substrate spaced below the source/drain regions.

25. The method of claim 21, wherein the ion implanting through the patterned gate stack comprises employing an implant energy appropriate to position a peak dopant concentration of the $V_t$ adjust region of the transistor within the channel region immediately adjacent the patterned gate stack.

26. The method of claim 21, further comprising forming insulative spacers on the opposing sidewalls after the ion implanting.

27. A method of forming DRAM circuitry comprising:
   at least partially forming a plurality of memory cell field effect transistor gates within a memory array area of a semiconductor substrate, the memory array area being configured for fabrication of a plurality of first conductivity type memory cell field effect transistors using said memory cell field effect transistor gates;
   at least partially forming a plurality of peripheral field effect transistor gates within a peripheral circuitry area of the semiconductor substrate which is peripheral to the memory array area, the peripheral circuitry area being configured for fabrication of a plurality of first conductivity type field effect transistors and a plurality of second conductivity type field effect transistors using said peripheral field effect transistor gates;
   masking at least some peripheral field effect transistor gates used for forming peripheral first conductivity type field effect transistors and masking at least some peripheral field effect transistor gates used for forming peripheral second conductivity type field effect transistors while ion implanting through the plurality of memory cell field effect transistor gates within the memory array area effective to form respective $V_t$ adjust regions of the transistors within channel regions in the semiconductor substrate within the memory array area; and
   forming source/drain regions operably proximate the respective channel regions within the memory array area.

28. The method of claim 27, wherein each of the plurality of memory cell field effect transistor gates further comprises laterally opposing sidewalls, wherein insulative spacers are formed adjacent each of the opposing sidewalls after the ion implanting.

29. The method of claim 28, wherein forming the insulative spacers comprises forming a layer of insulative material over at least the plurality of memory cell field effect transistor gates and anisotropically etching the insulative material without a masking step.

30. The method of claim 27, wherein the ion implanting effective to form $V_t$ adjust regions is also effective to form minority carrier barrier regions spaced below respective source/drain regions within the semiconductor substrate.

31. The method of claim 30, wherein the ion implanting is before the forming of the source/drain regions, the minority carrier barrier regions spaced below the to be received, respective source/drain regions.

32. The method of claim 30, wherein the ion implanting is after the forming of the source/drain regions, the minority carrier barrier regions spaced below the respective source/drain regions.

33. The method of claim 27, wherein the ion implanting comprises one or more implantations effective to form $V_t$ adjust regions and minority carrier barrier regions.

34. A method of forming a field effect transistor having a $V_t$ adjust implant and respective minority carrier barrier regions received below source/drain regions of the transistor on a substrate, sequentially comprising:

determining a required gate material layer thickness for each of one or more gate material layers to be received over a channel region of the transistor being formed and a required masking material thickness, if any, to be received over source/drain areas on opposing sides of the channel region to be effective to form a $V_t$ adjust region within the channel region and to form respective minority carrier barrier regions spaced beneath source/drain regions of the transistor being formed for a selected ion implant species at a selected ion implant energy;

forming the one or more gate material layers to the required thickness over the channel region and forming masking material, if any, of the required thickness over the source/drain areas; and conducting ion implanting with the selected ion implant species at the selected ion implant energy effective to form the $V_t$ adjust region and the respective minority carrier blocking regions to be spaced beneath source/drain regions.

35. The method of claim 34, further comprising, after the determining, forming at least the required one or more gate material layers and masking material, and conducting the ion implanting upon multiple semiconductor substrates.

36. The method of claim 34, where field effect transistor is a memory array transistor.

37. The method of claim 34, further comprising conducting the ion implanting prior to forming source/drain regions of the field effect transistor.

38. The method of claim 34, further comprising conducting the ion implanting after forming source/drain regions of the field effect transistor.

39. The method of claim 34, further comprising:

blanket forming the required thickness of the one or more gate material layers over the substrate;

forming masking material having a required thickness, if any, over the gate material;

patterning the masking material to expose regions of the gate material; and removing at least some of the one or more gate material layers from the exposed regions to at least partially form a transistor gate of the field effect transistor to be formed.

40. The method of claim 39, wherein the ion implanting is conducted after the removing.

41. The method of claim 34, wherein conducting ion implanting comprises employing an implant energy appropriate to position a peak dopant concentration of the $V_t$ adjust region within the channel region immediately adjacent the gate material.

42. A method of forming a field effect transistor comprising:

forming at least one gate material layer over a semiconductor substrate, the at least one gate material layer having a first thickness;

forming a photosensitive masking material over the at least one gate material layer;

patterning the photosensitive masking material to expose first portions of the at least one gate material layer and mask second portions of the at least one gate material layer;

removing only some of the first portions to partially define a transistor gate stack and a channel region thereunderneath of the field effect transistor to be formed, where remaining gate material of the first portions has a second thickness;

ion implanting through the transistor gate stack and the first portions to simultaneously form a $V_t$ adjust region within the channel region and minority carrier barrier regions received below the exposed gate material layer; and forming source/drain regions within the semiconductor substrate operably proximate the transistor gate stack.

43. The method of claim 42, wherein the forming of the source/drain regions is prior to the ion implanting.

44. The method of claim 42, wherein the forming of the source/drain regions is after the ion implanting.

45. The method of claim 42, wherein the ion implanting employs an ion implant energy appropriate to position a peak dopant concentration of the $V_t$ adjust region within the channel region immediately adjacent the transistor gate stack and to position the minority carrier barrier regions to be spaced below the source/drain regions.

46. The method of claim 45, wherein the ion implanting comprises one or more implantations effective to position the peak dopant concentration of the $V_t$ adjust region and the minority carrier barrier regions.

47. The method of claim 42, further comprising removing the patterned masking material before the ion implanting.

48. The method of claim 42, wherein the transistor gate stack comprises opposing side walls and further comprising forming insulative spacers on the transistor gate stack side walls after the ion implanting.

49. The method of claim 42, wherein the transistor gate stack comprises opposing side walls and further comprising forming insulative spacers on the transistor gate stack side walls before the ion implanting.

50. The method of claim 49, wherein the forming of the insulative spacers is conducted after forming the source/drain regions.

* * * * *

UNITED STATES PATENT AND TRADEMARK OFFICE
CERTIFICATE OF CORRECTION

PATENT NO. : 6,468,852 B1
DATED : October 22, 2002
INVENTOR(S) : Fernando Gonzalez et al.

It is certified that error appears in the above-identified patent and that said Letters Patent is hereby corrected as shown below:

Column 1,
Line 18, replace "encompasses a conductive electrode and an insulative layer" with
-- encompass a conductive electrode and an insulative layer --

Column 2,
Line 40, replace "of forming such devices. It would be also be advantageous" with -- of forming such devices. It would also be advantageous --

Column 3,
Line 51, Fig. 5, replace "accordance with and aspect of the invention." with
-- accordance with an aspect of the invention. --

Column 6,
Line 8, replace "adjacent stack 20. Such forming of gate stack 20 to have a" with
-- adjacent gate stack 20. Such forming of gate stack 20 to have a --
Line 32, replace "selecting a desired Rp for stack 20 and an appropriate" with
-- selecting a desired $R_p$ for stack 20 and an appropriate --
Line 63, replace "concentration of regions 32 and 34 are different form one" with
-- concentration of regions 32 and 34 are different from one --

Column 7,
Line 9, replace "employed for patterning gate stack 20, such material can" with
-- employed for patterning gate stack 20, such material can be --
Line 17, replace "method in accordance with present invention is shown." with
-- method in accordance with the present invention is shown. --

Column 8,
Line 58, replace "another method in accordance with present invention. Wafer" with
-- another method in accordance with the present invention. Wafer --

UNITED STATES PATENT AND TRADEMARK OFFICE
CERTIFICATE OF CORRECTION

PATENT NO. : 6,468,852 B1
DATED : October 22, 2002
INVENTOR(S) : Fernando Gonzalez et al.

It is certified that error appears in the above-identified patent and that said Letters Patent is hereby corrected as shown below:

Column 10,
Lines 40 and 41, replace "region of the transistor with the channel region there-from" with -- region of the transistor within the channel region there-from --

Signed and Sealed this

Twenty-second Day of July, 2003

JAMES E. ROGAN
*Director of the United States Patent and Trademark Office*